United States Patent
Masuda et al.

(10) Patent No.: US 9,099,553 B2
(45) Date of Patent: Aug. 4, 2015

(54) SEMICONDUCTOR DEVICE AND METHOD FOR MANUFACTURING SAME

(71) Applicant: Sumitomo Electric Industries, Ltd., Osaka-shi (JP)

(72) Inventors: Takeyoshi Masuda, Osaka (JP); Keiji Wada, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/709,915

(22) Filed: Dec. 10, 2012

(65) Prior Publication Data

US 2013/0181229 A1 Jul. 18, 2013

Related U.S. Application Data

(60) Provisional application No. 61/586,343, filed on Jan. 13, 2012.

(30) Foreign Application Priority Data

Jan. 13, 2012 (JP) .................................. 2012-004641

(51) Int. Cl.
*H01L 29/06* (2006.01)
*H01L 29/78* (2006.01)
*H01L 29/66* (2006.01)
(Continued)

(52) U.S. Cl.
CPC ........ *H01L 29/7827* (2013.01); *H01L 29/1095* (2013.01); *H01L 29/4236* (2013.01); *H01L 29/6606* (2013.01); *H01L 29/66068* (2013.01); *H01L 29/7813* (2013.01); *H01L 21/0485* (2013.01); *H01L 21/3065* (2013.01); *H01L 29/045* (2013.01); *H01L 29/1608* (2013.01); *H01L 29/41766* (2013.01); *H01L 29/45* (2013.01)

(58) Field of Classification Search
None
See application file for complete search history.

(56) References Cited

U.S. PATENT DOCUMENTS

| 5,688,725 A | 11/1997 | Darwish et al. | |
| 5,915,180 A * | 6/1999 | Hara et al. | 438/270 |

(Continued)

FOREIGN PATENT DOCUMENTS

| JP | 2-156678 A | 6/1990 |
| JP | 9-074193 A | 3/1997 |

(Continued)

OTHER PUBLICATIONS

International Search Report and Written Opinion in International Application No. PCT/JP2012/080822 dated Feb. 12, 2013.

(Continued)

*Primary Examiner* — David Vu
*Assistant Examiner* — Cuong Nguyen
(74) *Attorney, Agent, or Firm* — Venable LLP; Michael A. Sartori; Tamatane J. Aga

(57) ABSTRACT

A MOSFET includes: a substrate having a first trench formed therein, the first trench opening on a side of one main surface; a gate insulating film; and a gate electrode. The substrate includes an n type source region, a p type body region, an n type drift region, and a p type deep region making contact with the body region and extending to a region deeper than the first trench. The first trench is formed such that a distance between the wall surface and the deep region increases with increasing distance from the main surface of the substrate.

11 Claims, 8 Drawing Sheets

(51) Int. Cl.
*H01L 29/423* (2006.01)
*H01L 29/10* (2006.01)
H01L 21/04 (2006.01)
H01L 29/417 (2006.01)
H01L 29/45 (2006.01)
H01L 29/04 (2006.01)
H01L 29/16 (2006.01)
H01L 21/3065 (2006.01)

(56) References Cited

U.S. PATENT DOCUMENTS

| | | | |
|---|---|---|---|
| 5,945,708 | A | 8/1999 | Tihanyi |
| 5,976,936 | A | 11/1999 | Miyajima et al. |
| 6,008,520 | A | 12/1999 | Darwish et al. |
| 6,020,600 | A | 2/2000 | Miyajima et al. |
| 6,054,752 | A * | 4/2000 | Hara et al. ............ 257/629 |
| 6,573,534 | B1 | 6/2003 | Kumar et al. |
| 6,608,350 | B2 | 8/2003 | Kinzer et al. |
| 6,649,975 | B2 | 11/2003 | Baliga |
| 7,348,256 | B2 | 3/2008 | Miller, Jr. et al. |
| 7,453,119 | B2 | 11/2008 | Bhalla et al. |
| 7,459,365 | B2 | 12/2008 | Rub et al. |
| 7,514,743 | B2 | 4/2009 | Yang |
| 8,143,124 | B2 | 3/2012 | Challa et al. |
| 8,247,865 | B2 | 8/2012 | Hirler |
| 8,274,109 | B2 | 9/2012 | Zundel |
| 8,354,711 | B2 | 1/2013 | Zeng et al. |
| 8,390,060 | B2 | 3/2013 | Darwish et al. |
| 8,492,226 | B2 | 7/2013 | Mathew et al. |
| 8,519,473 | B2 | 8/2013 | Meiser et al. |
| 2007/0187751 | A1 | 8/2007 | Hu et al. |
| 2009/0072241 | A1* | 3/2009 | Harris et al. ............ 257/77 |
| 2009/0114969 | A1 | 5/2009 | Suzuki et al. |
| 2009/0230404 | A1* | 9/2009 | Masuda et al. ............ 257/77 |
| 2010/0062582 | A1 | 3/2010 | Fujikawa |
| 2010/0171173 | A1 | 7/2010 | Hsieh |
| 2011/0081756 | A1 | 4/2011 | Kobayashi |
| 2011/0121316 | A1 | 5/2011 | Harada |
| 2011/0254084 | A1 | 10/2011 | Terrill et al. |
| 2011/0260242 | A1 | 10/2011 | Jang |
| 2012/0037922 | A1 | 2/2012 | Kono et al. |
| 2013/0181229 | A1 | 7/2013 | Masuda et al. |
| 2013/0341712 | A1 | 12/2013 | Burke et al. |

FOREIGN PATENT DOCUMENTS

| | | |
|---|---|---|
| JP | 2005-057028 A | 3/2005 |
| JP | 2005-340685 A | 12/2005 |
| JP | 2007-258465 A | 10/2007 |
| JP | 2008-135653 A | 6/2008 |
| JP | 2008-205497 A | 9/2008 |
| JP | 2009-043966 A | 2/2009 |
| JP | 2009-117593 A | 5/2009 |
| JP | 2009-117820 A | 5/2009 |
| JP | 2010-238738 A | 10/2010 |
| JP | 2010-258387 A | 11/2010 |
| JP | 2011-171632 A | 9/2011 |
| JP | 2013-12590 | 1/2013 |

OTHER PUBLICATIONS

Notice of Allowance in U.S. Appl. No. 13/680,798, dated May 15, 2014.
Nakano et al., "690V, 1.00 mΩcm$^2$ 4H—SiC Double-Trench MOSFETs," 2011 International Conference on Silicon Carbide and Related Materials Abstract Book, p. 147 (Sep. 11, 2011).
International Search Report and Written Opinion in International Patent Application No. PCT/JP2012/078802 dated Feb. 12, 2013.
Office Action in U.S. Appl. No. 13/680,798, dated Jan. 22, 2014.
Notice of Grounds of Rejection issued in Japanese Patent Application No. 2012-004641 dated Jan. 20, 2015.
Notice of Grounds of Rejection in Japanese Patent Application No. 2011-277862, dated Apr. 21, 2015.

* cited by examiner

SEMICONDUCTOR DEVICE AND METHOD FOR MANUFACTURING SAME

BACKGROUND OF THE INVENTION

1. Field of the Invention

The present invention relates to a semiconductor device and a method for manufacturing the same, and more particularly to a semiconductor device having improved breakdown voltage characteristics and reduced ON resistance, as well as a method for manufacturing such a semiconductor device.

2. Description of the Background Art

In recent years, in order to achieve a high breakdown voltage, low loss, and the like of semiconductor devices, silicon carbide has been adopted as a material for semiconductor devices. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced ON resistance, and the like.

An exemplary semiconductor device adopting silicon carbide as its material is a MOSFET (Metal Oxide Semiconductor Field Effect Transistor) or the like. The MOSFET is a semiconductor device that controls existence/non-existence of an inversion layer in a channel region in accordance with a predetermined threshold voltage so as to conduct and interrupt a current. For example, a trench gate type MOSFET or the like characterized by formation of a channel region along a wall surface of a trench has been considered.

In the trench gate type MOSFET, ON resistance can be reduced, but breakdown voltage characteristics are disadvantageously deteriorated due to electric field concentration on a gate insulating film formed in a bottom portion of the trench. To address this, for example, it has been proposed to form in a substrate a p type deep region extending to a region as deep as or deeper than the trench, extend a depletion layer from a pn junction between the p type deep region and an n type drift region, and thereby mitigate electric field concentration on the bottom portion of the trench (see for example Japanese Patent Laying-Open No. 2009-117593 (Patent Literature 1)).

In the MOSFET proposed in Patent Literature 1, the trench and the deep region are each formed to extend in a thickness direction of the substrate in parallel. Therefore, when the MOSFET is miniaturized, a region between the trench and the deep region is narrowed and thus a passage for carriers is narrowed, resulting in an increase in ON resistance of the MOSFET.

SUMMARY OF THE INVENTION

The present invention has been made in view of the foregoing problem, and one object of the present invention is to provide a semiconductor device having improved breakdown voltage characteristics and reduced ON resistance, as well as a method for manufacturing such a semiconductor device.

A semiconductor device in accordance with the present invention includes: a substrate made of silicon carbide and having a first trench formed therein, the first trench opening on a side of one main surface; a gate insulating film disposed on and in contact with a wall surface of the first trench; and a gate electrode disposed on and in contact with the gate insulating film. The substrate includes a source region of a first conductivity type including the main surface of the substrate and the wall surface of the first trench, a body region of a second conductivity type making contact with the source region and including the wall surface of the first trench, a drift region of the first conductivity type making contact with the body region and including the wall surface of the first trench, and a deep region of the second conductivity type making contact with the body region and extending to a region deeper than the first trench. The first trench is formed such that a distance between the wall surface and the deep region increases with increasing distance from the main surface of the substrate.

In the semiconductor device in accordance with the present invention, the deep region of the second conductivity type extending to the region deeper than the first trench is formed in the substrate. Hence, electric field concentration on the gate insulating film can be suppressed by a depletion layer extending from a pn junction between the deep region and the drift region of the first conductivity type. Further, in the semiconductor device in accordance with the present invention, the first trench is formed such that the distance from the deep region increases with increasing distance from the main surface of the substrate. This can secure a wider region through which carriers pass within the substrate, resulting in a further reduction in ON resistance of the semiconductor device. Thus, according to the semiconductor device in accordance with the present invention, there can be provided a semiconductor device having improved breakdown voltage characteristics and reduced ON resistance.

In the semiconductor device, the wall surface of the first trench may form an obtuse angle relative to the main surface of the substrate. Thereby, the wider region through which carriers pass within the substrate is secured more readily.

In the semiconductor device, the substrate may have a second trench formed therein, the second trench penetrating the source region and reaching the body region, opening on the side of the main surface, and being shallower than the first trench. In addition, the semiconductor device may further comprise a contact electrode disposed on and in contact with a wall surface of the second trench. This facilitates injection of carriers from the contact electrode to the body region, resulting in an improved response speed of the semiconductor device.

In the semiconductor device, the substrate may have the second trench formed therein, the second trench being shallower than a contact surface between the body region and the drift region. Thereby, occurrence of punch-through in the body region is avoided more readily.

In the semiconductor device, the contact electrode may be disposed not to be on and in contact with the main surface of the substrate. Thereby, short circuit between the contact electrode and the gate electrode is readily avoided.

In the semiconductor device, a plane constituting the wall surface of the second trench may be a plane crossing a {0001} plane. Thereby, a metal composing the contact electrode is facilitated to be diffused into the substrate, and as a result, contact resistance between the contact electrode and the substrate can be further reduced.

In the semiconductor device, in a cross section along a thickness direction of the substrate including the first and second trenches, a fictitious straight line extending from the wall surface at a lowermost portion of the second trench in parallel with a {0001} plane may cross the wall surface of the first trench facing the second trench. Thereby, deterioration in breakdown voltage characteristics of the semiconductor device can be suppressed.

In the semiconductor device, in the cross section along the thickness direction of the substrate including the first and second trenches, the fictitious straight line may cross the wall surface of the first trench facing the second trench, without crossing the drift region. Thereby, the deterioration in breakdown voltage characteristics of the semiconductor device can be suppressed more effectively.

In the semiconductor device, a plane constituting the main surface of the substrate may be a plane having an off angle of 8° or smaller relative to a {0001} plane. Thereby, a substrate made of silicon carbide can be prepared more readily.

In the semiconductor device, a plane constituting the wall surface of the first trench may be a plane having an off angle of not less than 50° and not more than 65° relative to a {0001} plane. Thereby, channel mobility in the semiconductor device can be further improved.

A method for manufacturing a semiconductor device in accordance with the present invention includes the steps of: preparing a substrate made of silicon carbide and having a main surface; forming an active region in the substrate; forming a first trench opening on a side of the main surface of the substrate; disposing a gate insulating film on and in contact with a wall surface of the first trench; and disposing a gate electrode on and in contact with the gate insulating film. In the step of forming the active region, a source region of a first conductivity type, a body region of a second conductivity type, a drift region of the first conductivity type, and a deep region of the second conductivity type are formed, the source region including the main surface of the substrate, the body region making contact with the source region, the drift region making contact with the body region, and the deep region making contact with the body region. In the step of forming the first trench, the first trench is formed to have the wall surface at which the source region, the body region, and the drift region are exposed. The deep region and the first trench are formed such that the deep region is deeper than the first trench and a distance between the wall surface of the first trench and the deep region increases with increasing distance from the main surface of the substrate.

According to the method for manufacturing the semiconductor device in accordance with the present invention, there can be manufactured a semiconductor device in accordance with the present invention having improved breakdown voltage characteristics and reduced ON resistance.

As apparent from the description above, according to the semiconductor device and the method for manufacturing the same in accordance with the present invention, there can be provided a semiconductor device having improved breakdown voltage characteristics and reduced ON resistance, as well as a method for manufacturing such a semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
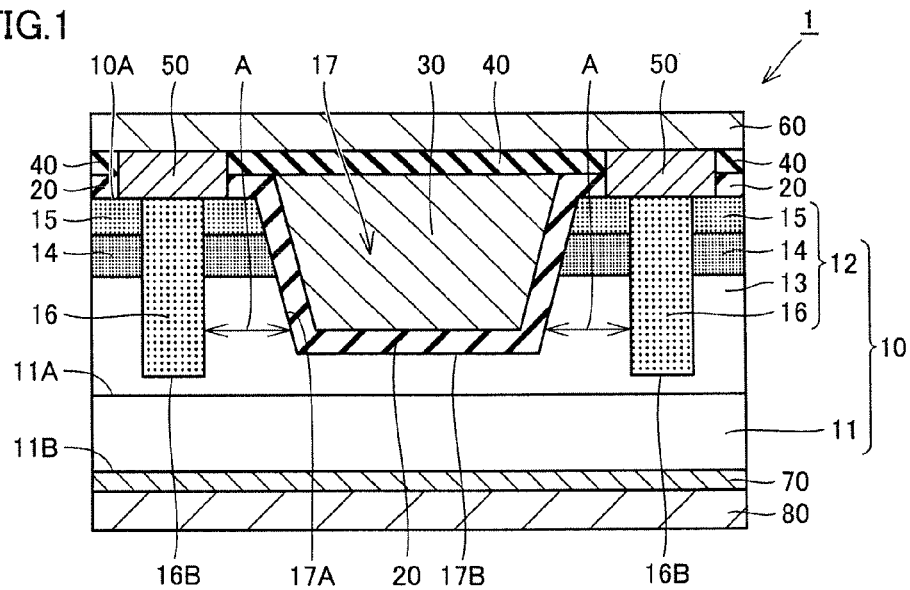
FIG. 1 is a schematic cross sectional view showing a structure of a MOSFET.

The following describes embodiments of the present invention with reference to the drawings. It should be noted that in the below-described drawings, the same or corresponding portions are given the same reference characters and are not described repeatedly. Further, in the present specification, an individual orientation is represented by [ ], a group orientation is represented by < >, an individual plane is represented by ( ) and a group plane is represented by { }. In addition, a negative index is supposed to be crystallographically indicated by putting "-" (bar) above a numeral, but is indicated by putting the negative sign before the numeral in the present specification.

Embodiment 1

Embodiment 1 as one embodiment of the present invention will now be described. First, a structure of a MOSFET 1 serving as a semiconductor device in accordance with the present embodiment will be described. Referring to FIG. 1, MOSFET 1 includes a substrate 10 made of silicon carbide and having a main surface 10A, a gate insulating film 20, a gate electrode 30, an interlayer insulating film 40, a source electrode 50, a source pad electrode 60, a drain electrode 70, and a drain pad electrode 80. Substrate 10 includes a base substrate 11 and a semiconductor layer 12. In semiconductor layer 12, a drift region 13, a body region 14, a source region 15, and a deep region 16 are formed. Substrate 10 has a first trench 17 formed therein, first trench 17 opening on a main surface 10A side and having wall surfaces 17A and a bottom surface 17B.

Base substrate 11 is made of silicon carbide, contains an n type impurity such as N (nitrogen), and therefore has n type conductivity (a first conductivity type). Drift region 13 is formed on a main surface 11A of base substrate 11. As with base substrate 11, drift region 13 contains an n type impurity such as N (nitrogen), and therefore has n type conductivity. The concentration thereof in drift region 13 is lower than that in base substrate 11.

Body region 14 is formed on drift region 13 (on a side opposite to a base substrate 11 side). Body region 14 contains a p type impurity such as Al (aluminum) or B (boron), and therefore has p type conductivity (a second conductivity type).

Source region 15 is formed on body region 14 (on a side opposite to a drift region 13 side). Source region 15 contains an n type impurity such as P (phosphorus), and therefore has n type conductivity as with base substrate 11 and drift region 13. Further, the concentration of the n type impurity contained in source region 15 is higher than that in drift region 13.

Deep region 16 is formed to make contact with source region 15, body region 14, and drift region 13 and extend to a region deeper than first trench 17 within semiconductor layer 12. Specifically, deep region 16 is formed to make contact with source electrode 50 and penetrate source region 15 and body region 14, and such that a contact surface 16B thereof with drift region 13 is located closer to drain electrode 70 than bottom surface 17B of first trench 17. As with body region 14, deep region 16 contains a p type impurity such as Al (aluminum), and therefore has p type conductivity. The concentration thereof in deep region 16 is higher than that in body region 14.

First trench 17 is formed to penetrate source region 15 and body region 14 and reach drift region 13. Specifically, first trench 17 is formed such that bottom surface 17B is located closer to source electrode 50 than contact surface 16B between deep region 16 and drift region 13. Further, first trench 17 is formed such that a distance between wall surface 17A and deep region 16 increases with increasing distance from main surface 10A of substrate 10. For example, first trench 17 is formed such that wall surface 17A forms an obtuse angle relative to main surface 10A of substrate 10 as shown in FIG. 1.

Thus, substrate 10 includes n type source region 15 including main surface 10A of substrate 10 and wall surface 17A of first trench 17, p type body region 14 making contact with source region 15 and including wall surface 17A of first trench 17, n type drift region 13 making contact with body region 14 and including wall surface 17A and bottom surface 17B of first trench 17, and p type deep region 16 making contact with body region 14 and extending to the region deeper than first trench 17.

Gate insulating film 20 is made of, for example, $SiO_2$ (silicon dioxide), and is disposed on and in contact with wall surfaces 17A and bottom surface 17B of first trench 17 and main surface 10A of substrate 10.

Gate electrode 30 is made of, for example, a conductor such as polysilicon having an impurity added therein. Gate electrode 30 is disposed on and in contact with gate insulating film 20 so as to fill first trench 17.

Interlayer insulating film 40 is made of, for example, $SiO_2$ (silicon dioxide), and is disposed on and in contact with gate insulating film 20 and gate electrode 30. Specifically, interlayer insulating film 40 is disposed such that interlayer insulating film 40 and gate insulating film 20 surround gate electrode 30, thus electrically insulating gate electrode 30 from source electrode 50.

Source electrode 50 is disposed on main surface 10A of substrate 10 in contact with source region 15 and deep region 16. Specifically, source electrode 50 is made of a material capable of making ohmic contact with source region 15, for example, $Ni_xSi_y$ (nickel silicide), $Ti_xSi_y$ (titanium silicide), $Al_xSi_y$ (aluminum silicide), or $Ti_xAl_ySi_z$ (titanium aluminum silicide). Source electrode 50 is electrically connected to source region 15.

Drain electrode 70 is formed on and in contact with a main surface 11B of base substrate 11 opposite to main surface 11A thereof. Drain electrode 70 is made of, for example, the same material as that for source electrode 50, and is electrically connected to base substrate 11.

Source pad electrode 60 is disposed on and in contact with interlayer insulating film 40 and source electrode 50. Specifically, source pad electrode 60 is made of, for example, a conductor such as Al (aluminum), and is electrically connected to source region 15 via source electrode 50.

Drain pad electrode 80 is disposed on and in contact with drain electrode 70. Specifically, as with source pad electrode 60, drain pad electrode 80 is made of, for example, a conductor such as Al (aluminum), and is electrically connected to base substrate 11 via drain electrode 70.

Next, an operation of MOSFET 1 serving as the semiconductor device in accordance with the present embodiment will be described. Referring to FIG. 1, in a state where a voltage applied to gate electrode 30 is less than a threshold voltage, i.e., in an OFF state, even if a voltage is applied to between source electrode 50 and drain electrode 70, a pn junction formed between body region 14 and drift region 13 is reverse-biased. Accordingly, MOSFET 1 is in an non-conductive state. On the other hand, when gate electrode 30 is fed with a voltage equal to or greater than the threshold voltage, carriers are accumulated along wall surface 17A of first trench 17 in body region 14, thereby forming an inversion layer. As a result, source region 15 and drift region 13 are electrically connected to each other, whereby a current flows between source electrode 50 and drain electrode 70. In the manner described above, MOSFET 1 operates.

As described above, in MOSFET 1 serving as the semiconductor device in accordance with the present embodiment, p type deep region 16 extending to the region deeper than first trench 17 is formed within semiconductor layer 12 of substrate 10. Hence, electric field concentration on gate insulating film 20 can be suppressed by a depletion layer extending from a pn junction between deep region 16 and n type drift region 13. Further, in MOSFET 1, first trench 17 is formed such that the distance from deep region 16 increases with increasing distance from main surface 10A of substrate 10. Specifically, in MOSFET 1, first trench 17 is formed such that a region A sandwiched between wall surface 17A of first trench 17 and deep region 16 becomes wider from a source electrode 50 side toward a drain electrode 70 side. Accordingly, in MOSFET 1, ON resistance of MOSFET 1 can be further reduced by securing wider region A as a region through which carriers pass within substrate 10. Thus, MOSFET 1 serving as the semiconductor device in accordance with the present embodiment is a semiconductor device having improved breakdown voltage characteristics and reduced ON resistance.

Further, in MOSFET 1, a plane constituting main surface 10A of substrate 10 may be a plane having an off angle of 8° or smaller relative to a {0001} plane.

Silicon carbide can be readily grown in a <0001> direction. Hence, when the plane constituting main surface 10A of substrate 10 is adapted to have an off angle falling within the above-described range relative to the {0001} plane, substrate 10 made of silicon carbide can be prepared more readily.

Further, in MOSFET 1, a plane constituting wall surface 17A of first trench 17 may be a plane having an off angle of not less than 50° and not more than 65° relative to the {0001} plane. Thereby, channel mobility in MOSFET 1 can be further improved.

Figure 2:
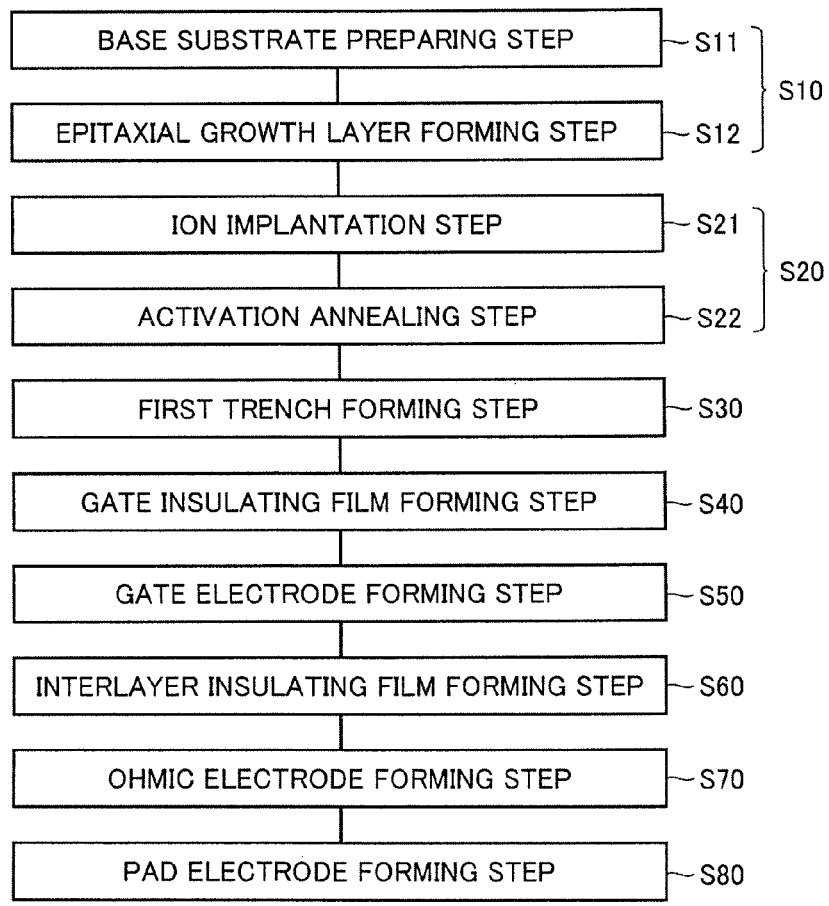
FIG. 2 is a flowchart schematically showing a method for manufacturing the MOSFET.

Next, a method for manufacturing the semiconductor device in accordance with the present embodiment will be described with reference to FIGS. 1 to 9. In the method for manufacturing the semiconductor device in accordance with the present embodiment, MOSFET 1 serving as the semiconductor device in accordance with the present embodiment can be manufactured. Referring to FIG. 2, first, a substrate preparing step is performed as step (S10). In this step (S10), steps (S11) and (S12) described below are performed to prepare substrate 10 made of silicon carbide.

Figure 3:
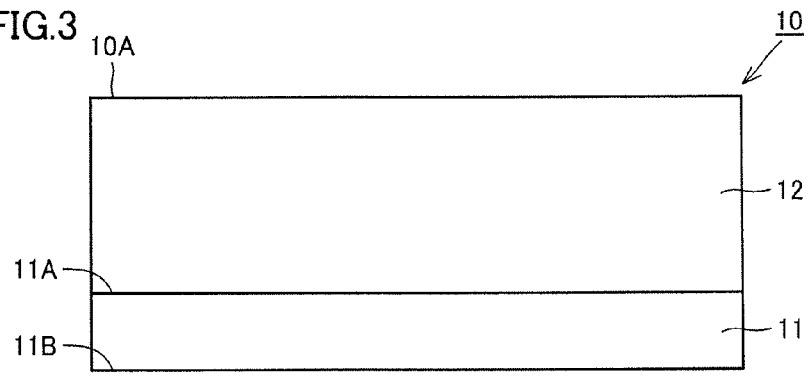
FIG. 3 is a schematic cross sectional view for illustrating the method for manufacturing the MOSFET.

First, as step (S11), a base substrate preparing step is performed. In this step (S11), an ingot (not shown) made of, for example, 4H-SiC is sliced to prepare base substrate 11 made of silicon carbide as shown in FIG. 3.

Next, as step (S12), an epitaxial growth layer forming step is performed. In this step (S12), referring to FIG. 3, semiconductor layer 12 is formed by epitaxial growth on main surface 11A of base substrate 11. In this way, there is prepared substrate 10 including base substrate 11 and semiconductor layer 12 and having main surface 10A.

Next, as step (S20), an active region forming step is performed. In this step (S20), steps (S21) and (S22) described below are performed to form an active region in substrate 10.

Figure 4:
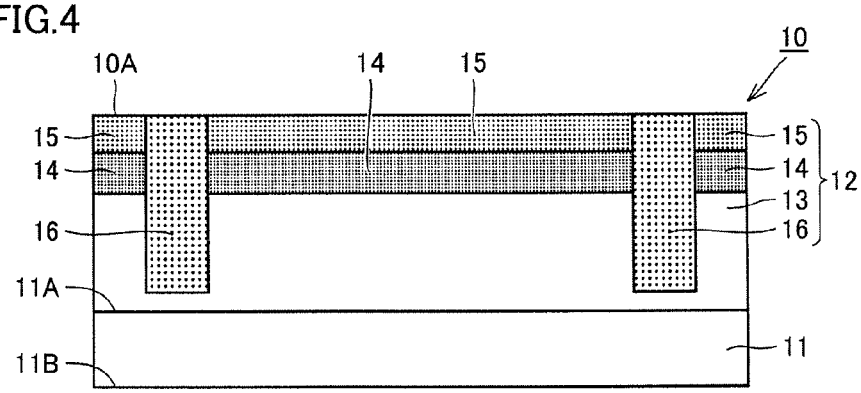
FIG. 4 is a schematic cross sectional view for illustrating the method for manufacturing the MOSFET.
Figure 5:
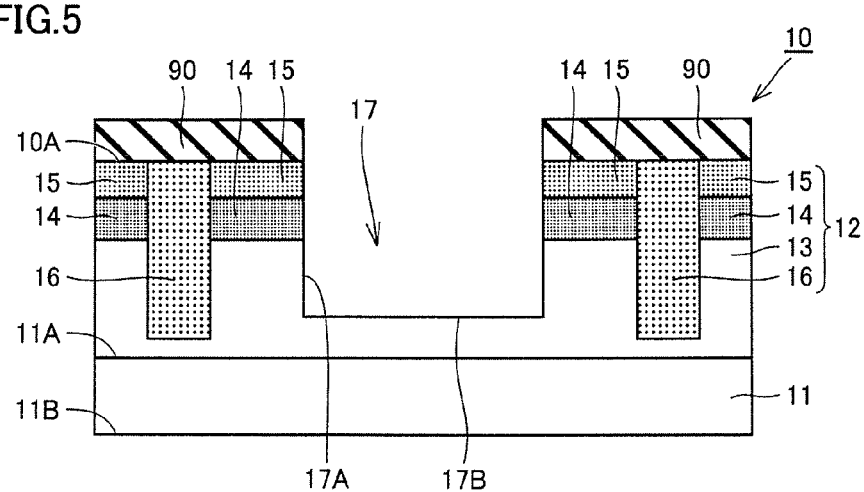
FIG. 5 is a schematic cross sectional view for illustrating the method for manufacturing the MOSFET.

First, as step (S21), an ion implantation step is performed. In this step (S21), referring to FIG. 4, for example, Al (aluminum) ions are first implanted into semiconductor layer 12, thereby forming p type body region 14. Next, for example, P (phosphorus) ions are implanted into semiconductor layer 12 to a depth shallower than the depth to which the Al ions have been implanted, thereby forming source region 15 of n type conductivity. Then, for example, Al (aluminum) ions are implanted into semiconductor layer 12 to a depth deeper than the depth to which the Al ions have been implanted, thereby forming deep region 16 of p type conductivity. Further, in semiconductor layer 12, a region in which none of body region 14, source region 15, and deep region 16 is formed serves as drift region 13. In this way, n type source region 15 including main surface 10A of substrate 10, p type body region 14 making contact with source region 15, n type drift region 13 making contact with body region 14, and p type deep region 16 making contact with source region 15, body region 14, and drift region 13 are formed as shown in FIG. 4.

Next, as step (S22), an activation annealing step is performed. In this step (S22), by heating substrate 10, the impurities implanted in step (S21) are activated. Thereby, desired carriers are generated in the regions having the impurities introduced therein, and the active region is formed in substrate 10.

Next, as step (S30), a first trench forming step is performed. In this step (S30), referring to FIGS. 5 and 6, first trench 17 opening on the main surface 10A side is formed in substrate 10. Specifically, referring to FIG. 5, first, for example a P-CVD (Plasma-Chemical Vapor Deposition) method is employed to form a mask 90 having an opening in conformity with a region of main surface 10A of substrate 10 in which first trench 17 is to be formed. Mask 90 is made of $SiO_2$ (silicon dioxide). Next, in an atmosphere containing for example $SF_6$ (sulfur hexafluoride) gas and oxygen, substrate 10 is etched by means of Inductive Coupled Plasma Reactive Ion Etching (ICP-RIE) or the like. Next, referring to FIG. 6, thermal etching is performed in an atmosphere containing for example oxygen and a halogen-based gas such as chlorine. After completion of the etching, mask 90 is removed. In this way, first trench 17 having wall surface 17A at which source region 15, body region 14, and drift region 13 are exposed and bottom surface 17B is formed in substrate 10.

Figure 6:
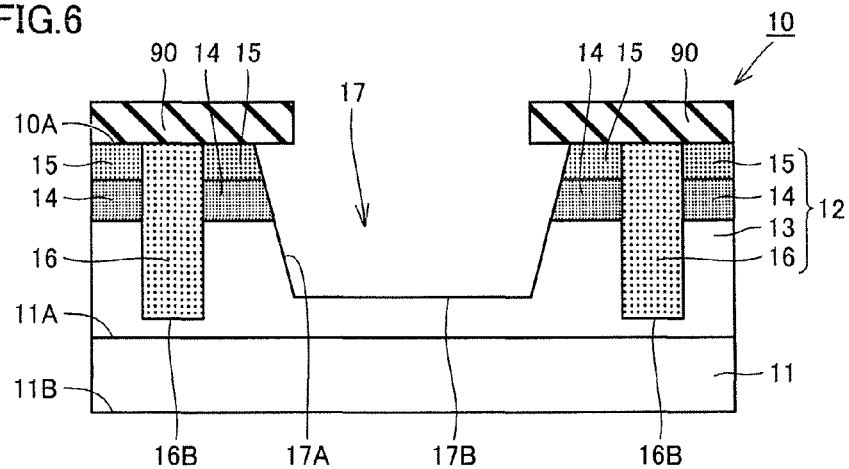
FIG. 6 is a schematic cross sectional view for illustrating the method for manufacturing the MOSFET.
Figure 7:
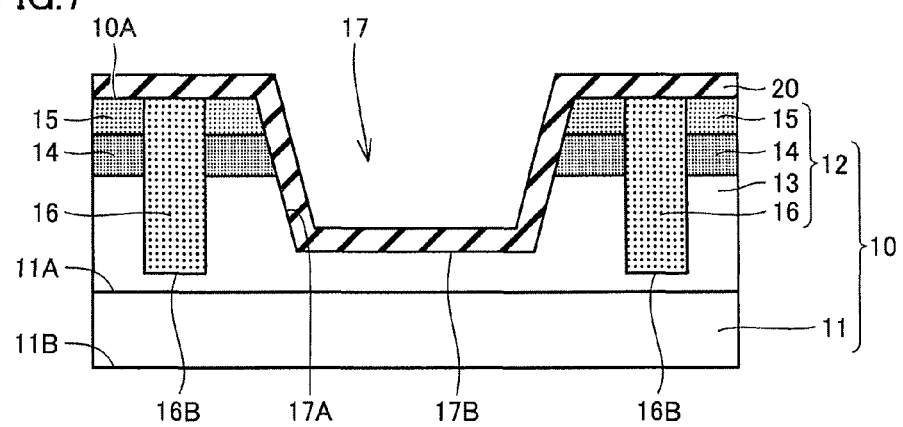
FIG. 7 is a schematic cross sectional view for illustrating the method for manufacturing the MOSFET.
Figure 8:
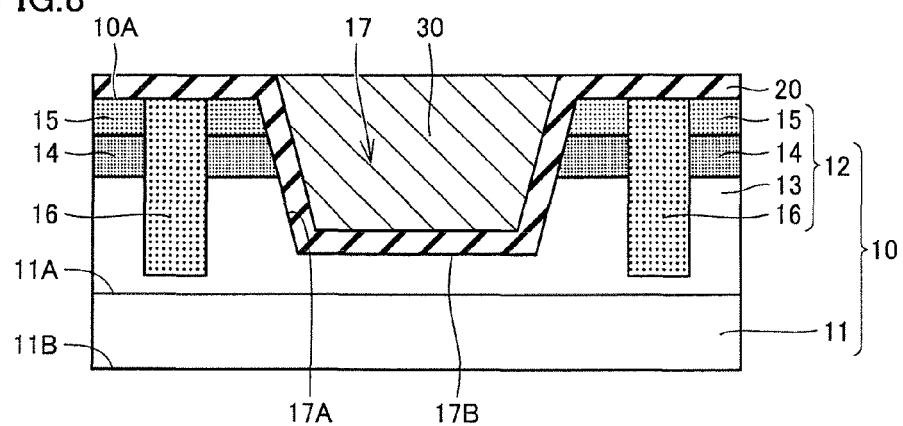
FIG. 8 is a schematic cross sectional view for illustrating the method for manufacturing the MOSFET.
Figure 9:
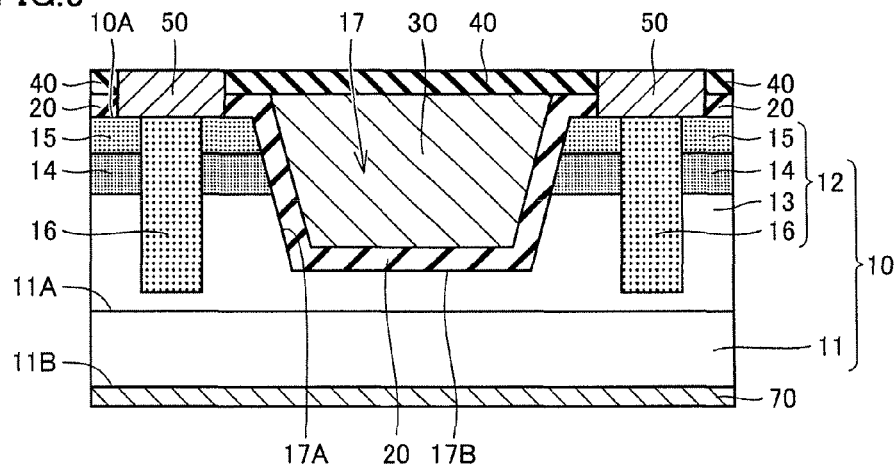
FIG. 9 is a schematic cross sectional view for illustrating the method for manufacturing the MOSFET.

Further, as shown in FIG. 6, deep region 16 and first trench 17 are formed such that deep region 16 is deeper than first trench 17, specifically such that contact surface 16B between deep region 16 and drift region 13 is located closer to drain electrode 70 (see FIG. 1) than bottom surface 17B of first trench 17. Furthermore, deep region 16 and first trench 17 are formed such that the distance between wall surface 17A of first trench 17 and deep region 16 increases with increasing distance from main surface 10A of substrate 10. Specifically, first trench 17 is formed such that wall surface 17A forms an obtuse angle relative to main surface 10A of substrate 10 as shown in FIG. 6.

Next, as step (S40), a gate insulating film forming step is performed. In this step (S40), referring to FIG. 7, by heating substrate 10 in an atmosphere containing for example oxygen, gate insulating film 20 made of $SiO_2$ (silicon dioxide) is disposed on and in contact with main surface 10A of substrate 10 and wall surfaces 17A and bottom surface 17B of first trench 17.

Next, as step (S50), a gate electrode forming step is performed. In this step (S50), referring to FIG. 8, for example, an LP (Low Pressure) CVD method is employed to form a polysilicon film having an impurity added therein, so as to fill first trench 17. Thereby, gate electrode 30 on and in contact with gate insulating film 20 is disposed.

Next, as step (S60), an interlayer insulating film forming step is performed. In this step (S60), referring to FIG. 9, for example, the CVD method is employed to form interlayer insulating film 40 made of $SiO_2$ (silicon dioxide) such that interlayer insulating film 40 and gate insulating film 20 surround gate electrode 30.

Next, as step (S70), an ohmic electrode forming step is performed. In this step (S70), referring to FIG. 9, first, interlayer insulating film 40 and gate insulating film 20 are removed from a region in which source electrode 50 is to be formed, thereby forming a region in which source region 15 and deep region 16 are exposed. Then, in this region, a metal film made of, for example, Ni is formed. Likewise, a metal film made of Ni is formed on main surface 11B of base substrate 11 opposite to main surface 11A thereof. Then, by heating the metal films, at least portions of the metal films are silicided, thereby forming source electrode 50 and drain electrode 70 electrically connected to substrate 10.

Next, as step (S80), a pad electrode forming step is performed. In this step (S80), referring to FIG. 1, for example, a deposition method is employed to form source pad electrode 60, which is made of a conductor such as Al (aluminum), so as to cover source electrode 50 and interlayer insulating film 40. Further, as with source pad electrode 60, for example, the deposition method is employed to form, on drain electrode 70, drain pad electrode 80 made of a conductor such as Al (aluminum). By performing steps (S10) to (S80) described above, MOSFET 1 is manufactured, thus completing the method for manufacturing the semiconductor device in accordance with the present embodiment. Thus, according to the method for manufacturing the semiconductor device in accordance with the present embodiment, there can be manufactured MOSFET 1 which serves as the semiconductor device in accordance with the present embodiment having improved breakdown voltage characteristics and reduced ON resistance.

Embodiment 2

Figure 10:
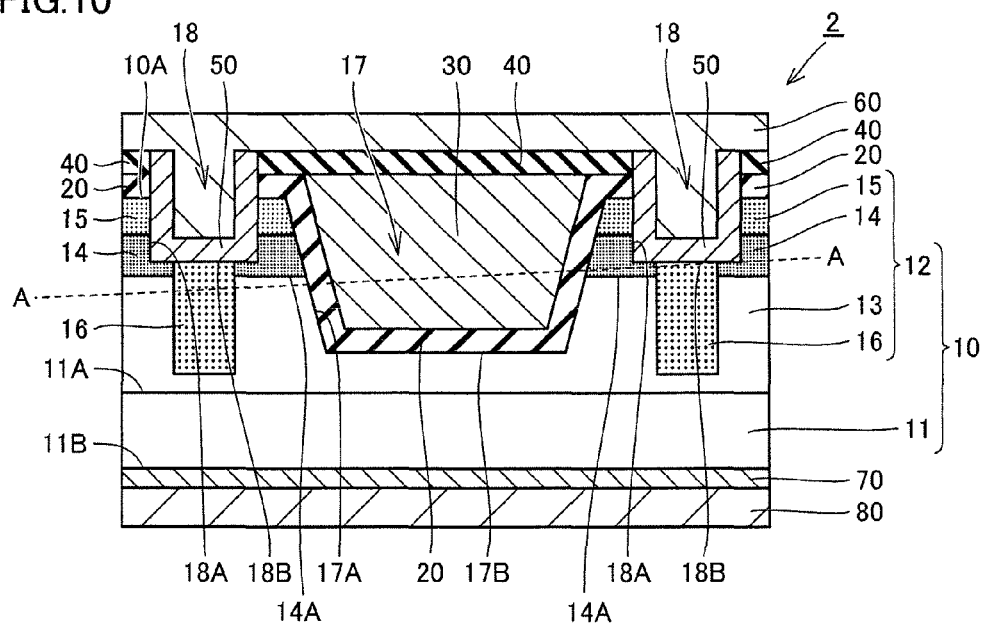
FIG. 10 is a schematic cross sectional view showing a structure of a MOSFET in accordance with Embodiment 2.

Next, Embodiment 2 as another embodiment of the present invention will be described. First, a structure of a MOSFET 2 serving as a semiconductor device in accordance with the present embodiment will be described. Referring to FIG. 10, MOSFET 2 basically has the same structure, operates in the same manner, and exhibits the same effect as those of MOSFET 1 in Embodiment 1. However, MOSFET 2 is different from MOSFET 1 in that, as shown in FIG. 10, a second trench 18 different from first trench 17 is formed in substrate 10, and source electrode 50 serving as a contact electrode is disposed on and in contact with wall surfaces 18A and a bottom surface 18B of second trench 18.

Referring to FIG. 10, second trench 18 opens on the main surface 10A side, and has wall surfaces 18A and bottom surface 18B. Specifically, second trench 18 is formed to penetrate source region 15 and reach body region 14, that is, to be shallower than first trench 17.

Source electrode 50 is disposed on and in contact with wall surfaces 18A and bottom surface 18B of second trench 18. Specifically, as in Embodiment 1, source electrode 50 is made of a material capable of making ohmic contact with source region 15, and disposed in contact with source region 15, body region 14, and deep region 16.

As described above, in MOSFET 2 serving as the semiconductor device in accordance with the present embodiment, source electrode 50 is disposed on and in contact with wall surfaces 18A and bottom surface 18B of second trench 18 which penetrates source region 15 and reaches body region 14. Hence, unlike that in MOSFET 1, source electrode 50 makes direct contact with body region 14 without deep region 16 interposed therebetween. Accordingly, in MOSFET 2, carriers can be injected from source electrode 50 to body region 14 without influence of a depletion layer extending from a pn junction between source region 15 and deep region 16. As a result, the operating state of MOSFET 2 is readily switched. Thus, MOSFET 2 serving as the semiconductor device in accordance with the present embodiment is a semiconductor device having an improved response speed.

Further, in MOSFET 2, second trench 18 shallower than a contact surface 14A between body region 14 and drift region 13 may be formed in substrate 10 as shown in FIG. 10. Specifically, second trench 18 not penetrating body region 14, more specifically, second trench 18 having bottom surface 18B located closer to source electrode 50 than contact surface 14A, may be formed in substrate 10. When second trench 18 is formed to penetrate body region 14, body region 14 becomes thin in a region in the vicinity of wall surfaces 18A and bottom surface 18B, and as a result, punch-through is likely to occur in the region. In contrast, by forming second trench 18 without penetrating body region 14 as described above, occurrence of punch-through in body region 14 is avoided more readily.

Further, in MOSFET 2, source electrode 50 may be disposed to be on and in contact with wall surfaces 18A and bottom surface 18B of second trench 18 and not to be on and in contact with main surface 10A of substrate 10, as shown in FIG. 10.

Thereby, a distance between source electrode 50 and gate electrode 30 becomes larger than that in a case where source electrode 50 is disposed on and in contact with main surface 10A of substrate 10. As a result, for example when MOSFET 2 is miniaturized, short circuit between source electrode 50 and gate electrode 30 is readily avoided.

Further, in MOSFET 2, a plane constituting wall surface 18A of second trench 18 may be a plane crossing the {0001} plane.

Substrate 10 made of silicon carbide has a characteristic that a metal is likely to be diffused in a direction parallel to the {0001} plane. Accordingly, when wall surface 18A of second trench 18 in contact with source electrode 50 is adapted to correspond to the plane crossing the {0001} plane, the metal composing source electrode 50 is facilitated to be diffused into substrate 10, thereby further reducing contact resistance between source electrode 50 and substrate 10.

Further, in MOSFET 2, in a cross section along a thickness direction of substrate 10 including first and second trenches 17, 18, a fictitious straight line A-A extending from wall surface 18A at a lowermost portion of second trench 18 in parallel with the {0001} plane may cross wall surface 17A of first trench 17 facing second trench 18. Specifically, as shown in FIG. 10, straight line A-A may cross wall surface 17A of first trench 17 facing second trench 18, without crossing drift region 13.

Thereby, the metal composing source electrode 50 can be more effectively suppressed from being diffused into drift region 13, in particular, into drift region 13 below bottom surface 17B of first trench 17. As a result, deterioration in breakdown voltage characteristics of MOSFET 2 can be suppressed.

Figure 11:
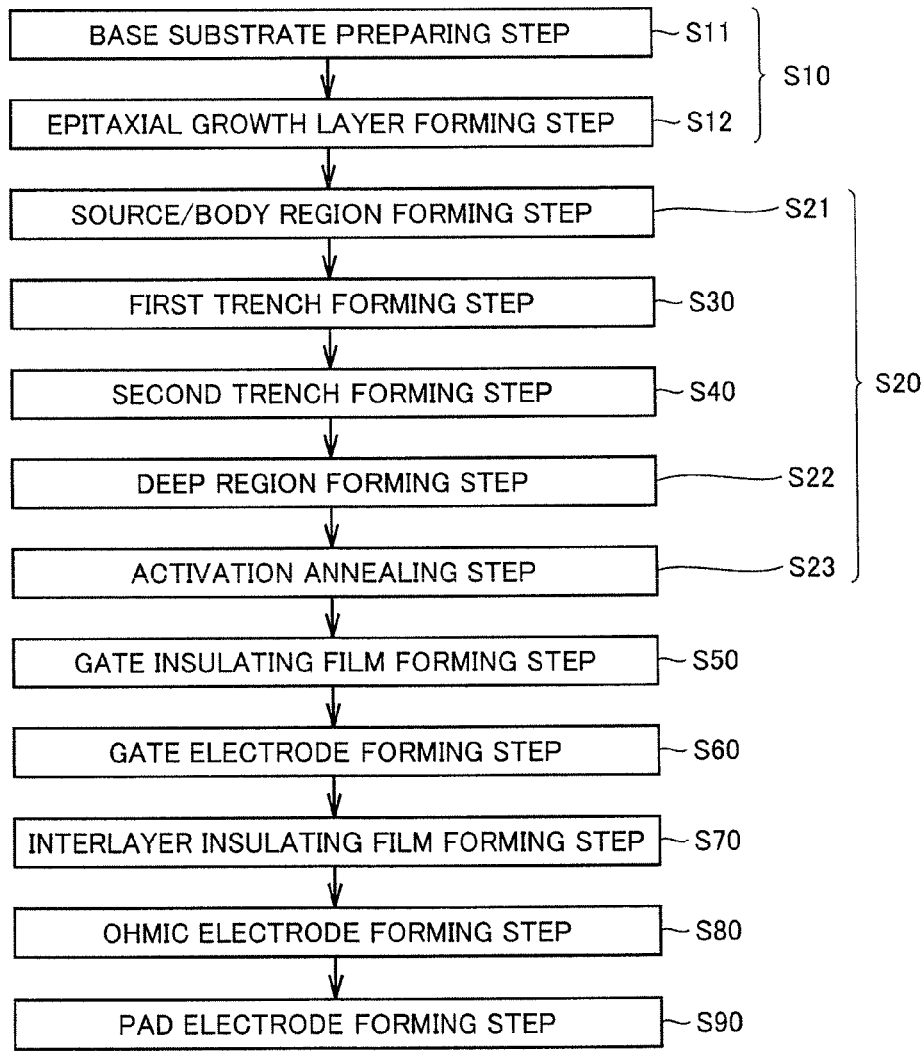
FIG. 11 is a flowchart schematically showing a method for manufacturing the MOSFET in accordance with Embodiment 2.
Figure 12:
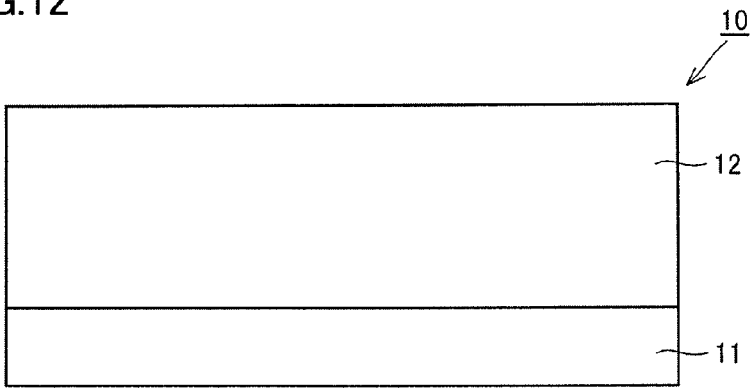
FIG. 12 is a schematic cross sectional view for illustrating the method for manufacturing the MOSFET in accordance with Embodiment 2.

Next, a method for manufacturing the semiconductor device in accordance with the present embodiment will be described. In the method for manufacturing the semiconductor device in accordance with the present embodiment, MOSFET 2 serving as the semiconductor device in accordance with the present embodiment is manufactured. Referring to FIG. 11, first, a substrate preparing step is performed as step (S10). In this step (S10), referring to FIG. 12, as in Embodiment 1, a base substrate preparing step (S11) and an epitaxial growth layer forming step (S12) are performed to prepare substrate 10 made of silicon carbide and including base substrate 11 and semiconductor layer 12.

Next, as step (S20), an active region forming step is performed. In this step (S20), steps (S21) to (S23) described below are performed to form an active region in substrate 10. It should be noted that, as shown in FIG. 11, steps (S22) and (S23) are performed after completion of steps (S30) and (S40).

Figure 13:
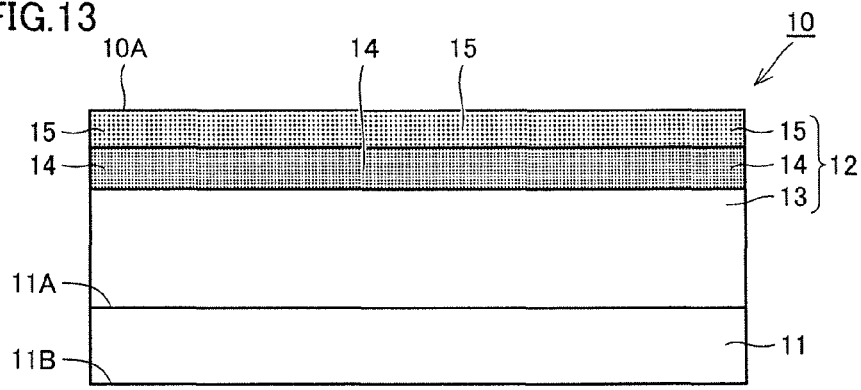
FIG. 13 is a schematic cross sectional view for illustrating the method for manufacturing the MOSFET in accordance with Embodiment 2.

First, as step (S21), a source/body region forming step is performed. In this step (S21), referring to FIG. 13, for example, Al (aluminum) ions are first implanted into semiconductor layer 12, thereby forming p type body region 14. Next, for example, P (phosphorus) ions are implanted into semiconductor layer 12 to a depth shallower than the depth to which the Al ions have been implanted, thereby forming n type source region 15.

Figure 14:
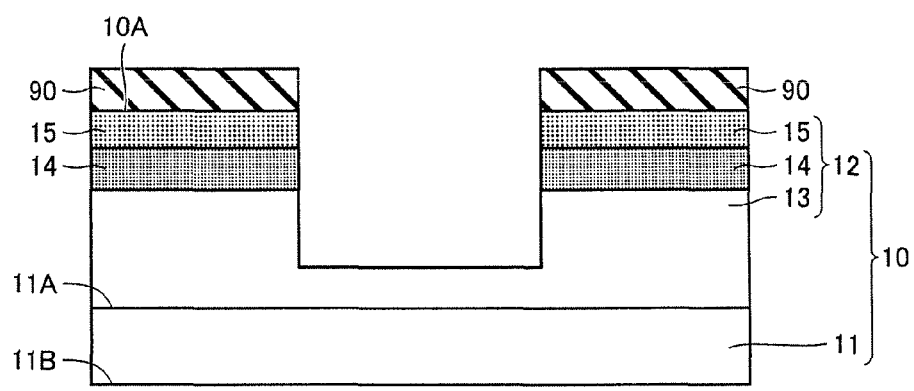
FIG. 14 is a schematic cross sectional view for illustrating the method for manufacturing the MOSFET in accordance with Embodiment 2.
Figure 15:
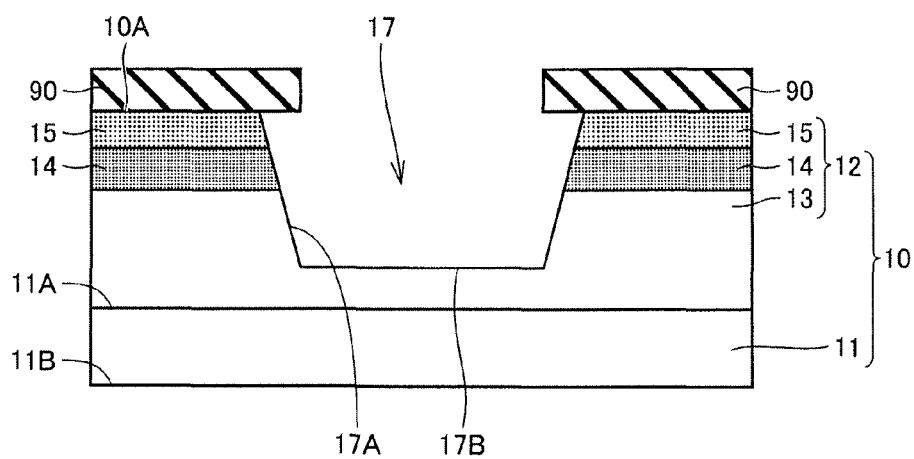
FIG. 15 is a schematic cross sectional view for illustrating the method for manufacturing the MOSFET in accordance with Embodiment 2.

Next, as step (S30), a first trench forming step is performed. In this step (S30), referring to FIGS. 14 and 15, first trench 17 opening on the main surface 10A side and having wall surfaces 17A and bottom surface 17B is formed in substrate 10, as in Embodiment 1.

Figure 16:
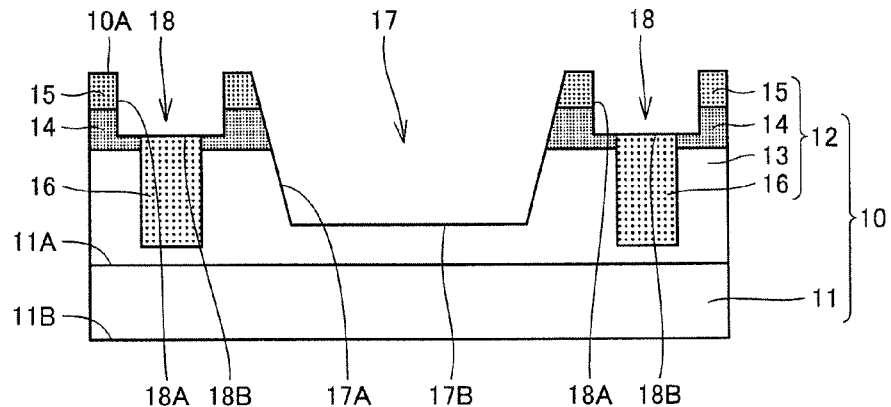
FIG. 16 is a schematic cross sectional view for illustrating the method for manufacturing the MOSFET in accordance with Embodiment 2.

Next, as step (S40), a second trench forming step is performed. In this step (S40), referring to FIG. 16, substrate 10 is etched by means of, for example, ICP-RIE, thereby forming second trench 18 opening on the main surface 10A side and having wall surfaces 18A and bottom surface 18B.

Next, as step (S22), a deep region forming step is performed. In this step (S22), referring to FIG. 16, for example, Al (aluminum) ions are implanted into a region including bottom surface 18B of second trench 18 within semiconductor layer 12, thereby forming p type deep region 16 extending to the region deeper than first trench 17.

Next, as step (S23), an activation annealing step is performed. In this step (S23), as in Embodiment 1, by heating substrate 10, the impurities implanted in steps (S21) and (S22) are activated, and desired carriers are generated in the regions having the impurities introduced therein.

Figure 17:
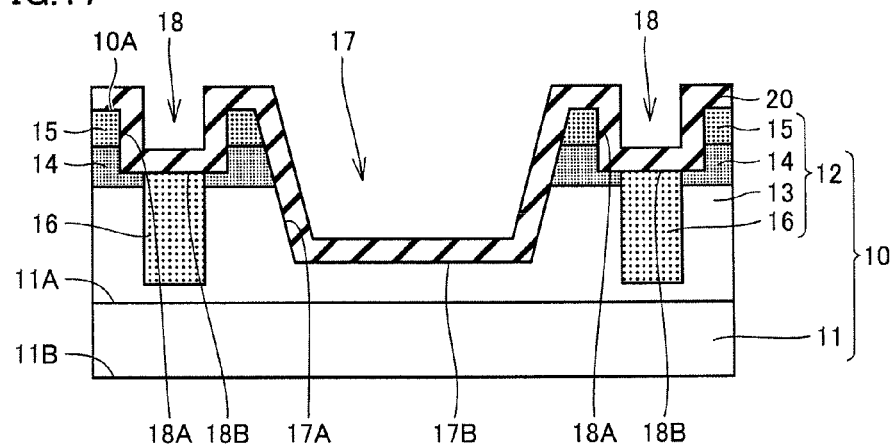
FIG. 17 is a schematic cross sectional view for illustrating the method for manufacturing the MOSFET in accordance with Embodiment 2.

Next, as step (S50), a gate insulating film forming step is performed. In this step (S50), referring to FIG. 17, as in Embodiment 1, by heating substrate 10 in an atmosphere containing for example oxygen, gate insulating film 20 made of $SiO_2$ (silicon dioxide) is formed on and in contact with main surface 10A of substrate 10, wall surfaces 17A and bottom surface 17B of first trench 17, and wall surfaces 18A and bottom surface 18B of second trench 18.

Figure 18:
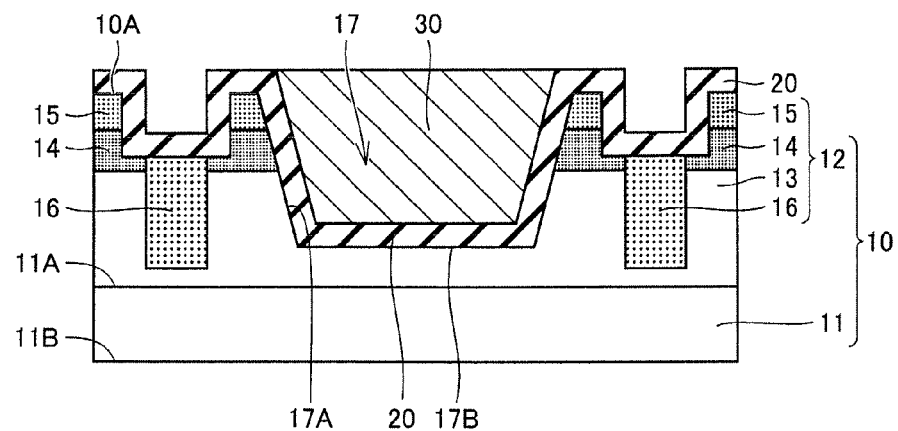
FIG. 18 is a schematic cross sectional view for illustrating the method for manufacturing the MOSFET in accordance with Embodiment 2.

Next, as step (S60), a gate electrode forming step is performed. In this step (S60), referring to FIG. 18, as in Embodiment 1, gate electrode 30 on and in contact with gate insulating film 20 is formed.

Figure 19:
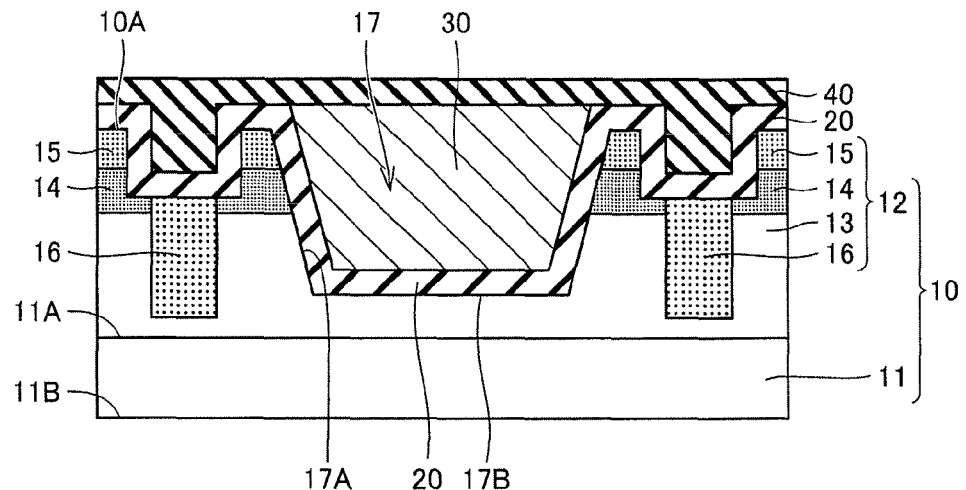
FIG. 19 is a schematic cross sectional view for illustrating the method for manufacturing the MOSFET in accordance with Embodiment 2.

Next, as step (S70), an interlayer insulating film forming step is performed. In this step (S70), referring to FIG. 19, as in Embodiment 1, interlayer insulating film 40 is formed such that interlayer insulating film 40 and gate insulating film 20 surround gate electrode 30.

Figure 20:
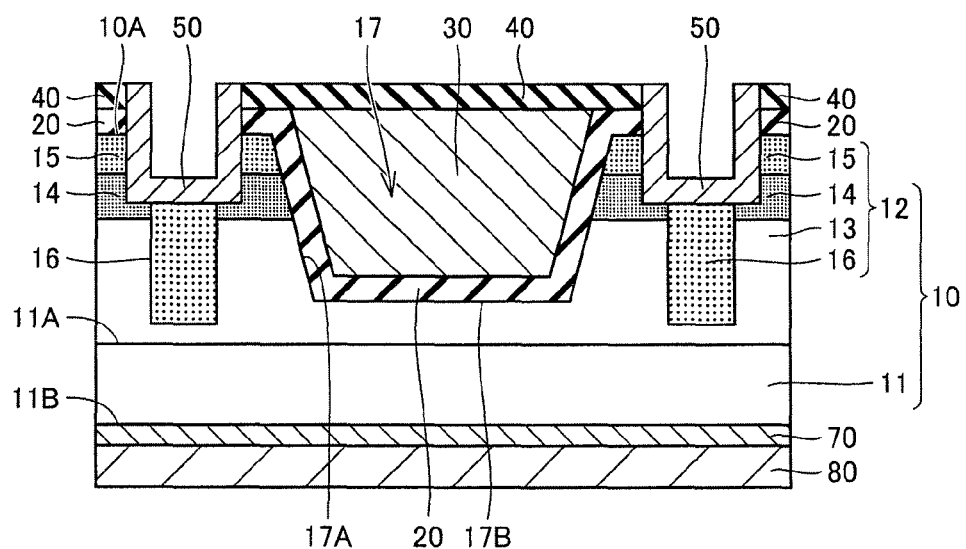
FIG. 20 is a schematic cross sectional view for illustrating the method for manufacturing the MOSFET in accordance with Embodiment 2.

Next, as step (S80), an ohmic electrode forming step is performed. In this step (S80), referring to FIG. 20, first, interlayer insulating film 40 and gate insulating film 20 are removed from a region in which source electrode 50 is to be formed, thereby forming a region in which source region 15, body region 14, and deep region 16 are exposed. Then, in this region, a metal film made of, for example, Ni is formed. Likewise, a metal film made of Ni is formed on main surface 11B of base substrate 11 opposite to main surface 11A thereof. Then, by heating the metal films, at least portions of the metal films are silicided, thereby forming source electrode 50 and drain electrode 70 electrically connected to substrate 10.

Next, as step (S90), a pad electrode forming step is performed. In this step (S90), referring to FIG. 10, as in Embodiment 1, source pad electrode 60 which covers source electrode 50 and interlayer insulating film 40, and drain pad electrode 80 which covers drain electrode 70 are formed. By performing steps (S10) to (S90) described above, MOSFET 2 is manufactured, thus completing the method for manufacturing the semiconductor device in accordance with the present embodiment.

The semiconductor device and the method for manufacturing the semiconductor device in accordance with the present invention are particularly advantageously applicable to a semiconductor device which is required to have improved breakdown voltage characteristics and reduced ON resistance, as well as a method for manufacturing such a semiconductor device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
 a substrate made of silicon carbide and having a first trench formed therein, said first trench opening on a side of one main surface;
 a gate insulating film disposed on and in contact with a wall surface of said first trench; and
 a gate electrode disposed on and in contact with said gate insulating film, said substrate including
   a source region of a first conductivity type including said main surface of said substrate and said wall surface of said first trench,
   a body region of a second conductivity type making contact with said source region and including said wall surface of said first trench,
   a drift region of the first conductivity type making contact with said body region and including said wall surface of said first trench, and
   a pair of deep regions of the second conductivity type making contact with said body region and said source region, and extending to a region deeper than said first trench, wherein said pair of deep regions is disposed at symmetrical positions with respect to a center of said first trench when viewed in cross-section,
 said first trench being formed such that a distance between said wall surface and said deep region increases with increasing distance from said main surface of said substrate.

2. The semiconductor device according to claim 1, wherein said wall surface of said first trench forms an obtuse angle relative to said main surface of said substrate.

3. The semiconductor device according to claim 1, wherein said substrate has a second trench formed therein, said second trench penetrating said source region and reaching said body region, opening on the side of said main surface, and being shallower than said first trench, and said semiconductor device further comprises a contact electrode disposed on and in contact with a wall surface of said second trench.

4. The semiconductor device according to claim 3, wherein said substrate has said second trench formed therein, said second trench being shallower than a contact surface between said body region and said drift region.

5. The semiconductor device according to claim 3 wherein said contact electrode is disposed not to be on and in contact with said main surface of said substrate.

6. The semiconductor device according to claim 3, wherein a plane constituting said wall surface of said second trench is a plane crossing a {0001} plane.

7. The semiconductor device according to claim 3, wherein in a cross section along a thickness direction of said substrate including said first and second trenches, a fictitious straight line extending from said wall surface at a lowermost portion of said second trench in parallel with a {0001} plane crosses said wall surface of said first trench facing said second trench.

8. The semiconductor device according to claim 7, wherein in the cross section along the thickness direction of said substrate including said first and second trenches, said fictitious straight line crosses said wall surface of said first trench facing said second trench, without crossing said drift region.

9. The semiconductor device according to claim 1, wherein a plane constituting said main surface of said substrate is a plane having an off angle of 8° or smaller relative to a {0001} plane.

10. The semiconductor device according to claim 1, wherein a plane constituting said wall surface of said first trench is a plane having an off angle of not less than 50° and not more than 65° relative to a {0001} plane.

11. The semiconductor device according to claim 1, wherein said deep region is formed to penetrate said source region and said body region and such that a contact surface thereof with said drift region is located closer to another main surface of said substrate than a bottom surface of said first trench, said another main surface is the main surface of said substrate opposite to said one main surface of said substrate.

* * * * *